(12) United States Patent
Spencer et al.

(10) Patent No.: US 9,261,628 B2
(45) Date of Patent: Feb. 16, 2016

(54) PHOTOVOLTAIC DEVICE WITH PATTERNED GLASS CONCENTRATOR

(75) Inventors: Matthew Spencer, Gray, TN (US); Christopher R. Cording, Kingsport, TN (US)

(73) Assignee: AGC FLAT GLASS NORTH AMERICA, INC., Alpharetta, GA (US)

( * ) Notice: Subject to any disclaimer, the term of this patent is extended or adjusted under 35 U.S.C. 154(b) by 452 days.

(21) Appl. No.: 12/835,804

(22) Filed: Jul. 14, 2010

(65) Prior Publication Data

US 2011/0011445 A1    Jan. 20, 2011

Related U.S. Application Data

(60) Provisional application No. 61/225,513, filed on Jul. 14, 2009.

(51) Int. Cl.
| | |
|---|---|
| H01L 31/0232 | (2014.01) |
| G02B 3/00 | (2006.01) |
| H02S 40/20 | (2014.01) |
| H01L 31/054 | (2014.01) |
| F24J 2/08 | (2006.01) |

(52) U.S. Cl.
CPC .......... *G02B 3/0031* (2013.01); *H01L 31/0543* (2014.12); *H02S 40/20* (2014.12); *F24J 2/08* (2013.01); *Y02E 10/52* (2013.01); *Y10T 29/41* (2015.01)

(58) Field of Classification Search
USPC .................. 136/244, 246, 251, 259
See application file for complete search history.

(56) References Cited

U.S. PATENT DOCUMENTS

| | | | | |
|---|---|---|---|---|
| 4,162,174 A | * | 7/1979 | Kaplow et al. | 136/246 |
| 4,638,110 A | * | 1/1987 | Erbert | 136/246 |
| 5,716,442 A | * | 2/1998 | Fertig | 136/246 |
| 6,399,874 B1 | * | 6/2002 | Olah | 136/259 |
| 6,653,551 B2 | | 11/2003 | Chen | |
| 7,638,708 B2 | * | 12/2009 | Fork et al. | 136/246 |
| 2004/0103938 A1 | * | 6/2004 | Rider | 136/259 |
| 2004/0173256 A1 | | 9/2004 | Kageyama et al. | |
| 2005/0081908 A1 | * | 4/2005 | Stewart | 136/246 |

(Continued)

FOREIGN PATENT DOCUMENTS

| | | |
|---|---|---|
| JP | 61-241982 A | 10/1986 |
| JP | H7-193267 A | 7/1995 |
| JP | 2002-293553 A | 10/2002 |

(Continued)

OTHER PUBLICATIONS

Gibson et al., U.S. Appl. No. 61/154,357, filed Feb. 20, 2009.*

(Continued)

*Primary Examiner* — Jayne Mershon
(74) *Attorney, Agent, or Firm* — Rothwell, Figg, Ernst & Manbeck, P.C.

(57) ABSTRACT

The present invention provides a photovoltaic device having an optical component that is capable of concentrating solar energy and method of making the same. More specifically, the present invention provides for an on-line produced patterned glass component that is capable of concentrating solar energy and allows for significantly less photovoltaic material to be used in a photovoltaic device. The present invention also provides for an on-line method of making the patterned glass and a method for making a photovoltaic device incorporating the patterned glass described herein.

27 Claims, 4 Drawing Sheets

(56) References Cited

U.S. PATENT DOCUMENTS

2008/0115828 A1* 5/2008 Taylor ............................ 136/256
2010/0294338 A1* 11/2010 Gibson et al. ................. 136/246

FOREIGN PATENT DOCUMENTS

| JP | 2006-343406 | * | 12/2006 |
| JP | 2008-83641 | A | 4/2008 |
| JP | 2009-88503 | A | 4/2009 |
| TW | 200423416 | A | 5/2005 |
| WO | 2011/008811 | A1 | 1/2001 |

OTHER PUBLICATIONS

PCT International Search Report and the Written Opinion, issued in PCT/US 10/41907 on Aug. 31, 2010, 12 pages.
Chinese Office Action, issued in CN 201080036082.5 on Feb. 26, 2014.
Examination Report, issued in AU 2010273516 on Nov. 29, 2013, 3 pages.
Japanese Office Action, issued in JP 2012-520736 on Jan. 21, 2014, including English language translation, 7 pages.
Japanese Office Action, issued in JP 2012-520736 on Jun. 10, 2014, including English language translation, 4 pages.
Notice of Release of Reconsideration before Appeal, issued in JP 2012-520736 on Mar. 31, 2015, including English language translation, 2 pages.
Report on Reconsideration before Appeal, issued in JP 2012-520736 mailed on Mar. 31, 2015, including English language translation, 9 pages.
Korean Office Action, issued in KR 10-2012-7003764 on Jun. 19, 2014, including English language translation, 11 pages.
Chilean Office Action, issued in CL 113-2012 on Jul. 7, 2014, 6 pages.
Chilean Office Action, issued in CL 113-2012 on Jan. 15, 2015, 6 pages.
Malaysian Examination Report, issued in MY PI 212000147 on Jan. 30, 2015, 4 pages.
Israeli Official Notification, issued in IL 217505 on Feb. 12, 2015, 4 pages.
Taiwanese Office Action, issued in TW 099123229 on Feb. 25, 2015, 14 pages.
Japanese Office Action issued in JP 2014-209320 on Aug. 4, 2015, including English Language translation, 11 pages.
Japanese Office Action issued in JP 2012-520736 on Oct. 6, 2015, including English Language translation, 24 pages.

* cited by examiner

PHOTOVOLTAIC DEVICE WITH PATTERNED GLASS CONCENTRATOR

CROSS-REFERENCE TO RELATED APPLICATION

This application claims the benefit of U.S. Provisional Application No. 61/225,513, filed Jul. 14, 2009, which is hereby incorporated by reference in its entirety into the present application.

BACKGROUND OF THE INVENTION

1. Field of the Invention

The present invention relates generally to photovoltaic devices, and more particularly to patterned glass for use in photovoltaic cells that is capable of concentrating solar energy.

2. Discussion of the Background

All United States Patents and Patent Applications referred to herein are hereby incorporated by reference in their entireties. In the case of conflict, the present specification, including definitions, will control.

As the global population continues to grow, so does the demand for energy and energy sources. Fossil fuel consumption has seen steady increases during the last century, as expected for an energy thirsty global population. It was estimated that in 2004, 86% of human-produced energy came from the burning of fossil fuels. Fossil fuels are non-renewable resources and fossil fuel reserves are being depleted quicker than they can be replaced. As a result, a movement toward the development of renewable energy has been undertaken to meet increased demand for energy. Over the last ten to twenty years, there has been an increased focus on developing technology to efficiently harness energy from alternative sources, such as solar, hydrogen and wind energy to meet the increased global demand.

Of the alternative sources, the sun is considered the most abundant natural resource, with an infinite supply of energy showering the Earth on a daily basis. Numerous technologies exist that are directed to capturing the sun's light energy and converting it into electricity. A photovoltaic (PV) module represents such a technology and, to date, has found many applications in areas such as remote power systems, space vehicles and consumer products such as wireless devices.

Energy from the sun, while vast and abundant, is actually quite diffuse. For example, the generation of about a gigawatt of power using modern PV systems would require an area of approximately four square miles of silicon. The use of such large amounts of silicon is the biggest cost factor imparted to PV device manufacturers, who, in turn, pass along the cost to customers who wish to purchase and utilize such PV devices. To date, electricity generated from PV systems is more expensive than electricity generated from the traditional burning of fossil fuels, thus, hindering electricity generated from PV systems from being economically competitive with electricity generated from fossil fuels.

One avenue that is being taken to reduce the cost of generating electricity from PV systems is to use less PV material, such as silicon, in the PV device. By using less PV material, naturally, there is less space, or surface area, potentially available for being hit by the sun's energy. To be able to practically utilize PV systems that possess less silicon material without a significant drop-off in PV device conversion efficiency, solar concentrators have been used as a means to focus the sun's energy onto a smaller area of silicon.

The idea of solar concentration to reduce the size of PV systems has been around for decades, but has only taken off recently with the advancement in the efficiency of PV devices. There exists a number of different optical components that can be used to concentrate solar energy, including curved mirrors, patterned plastic sheets, curved metal reflectors and special lenses, such as Fresnel lenses. Incorporation of these optical components has given rise to a class of PV systems known as "concentrator" PV devices.

The fabrication of "concentrator" PV devices offers advantages over flat plate, or non-concentrator, PV devices. These advantages can include, but are not limited to: 1) concentrator PV devices can increase power output while simultaneously reducing the number of solar cells needed; and 2) concentrator PV devices can utilize solar cells that are of a much smaller surface area, which are easier to mass-produce as compared to large surface area solar cells. While offering the aforementioned advantages, the optical components themselves (e.g., curved mirrors, patterned plastic sheets, curved metal reflectors or special lenses) can be quite expensive, thereby somewhat off-setting the reduced costs associated with using less PV material in a concentrator PV device. Moreover, these optical components vary in terms of the increase in energy output they provide for the PV device (as compared with non-concentrator PV devices) and increased costs. For example, one such PV device, produced by Solaria, utilizes a plastic V-groove patterned sheet in a PV device. The plastic patterned sheet is flat on one optical surface and has a series of adjacently disposed triangular (i.e., V-groove) patterns disposed on the other optical surface. The PV device includes solar cell material with the patterned plastic sheet disposed on the solar cell material (with V-groove pattern directed towards the solar cell material) and requires the use of cover glass disposed on top of the plastic sheet. While more energy efficient than non-concentrator PV devices, the PV device suffers from the drawback that the production of the patterned plastic sheet is expensive, thereby off-setting the reduced costs associated with having less solar cell material. Moreover, the plastic sheet requires the use of cover glass, which adds to the costs, and the increase in energy output is limited Thus, there remains a need in the art for a concentrator PV device that incorporates an optical component that can be easily and inexpensively produced, that maximizes cost savings and provides increased energy output of the PV device.

SUMMARY OF THE INVENTION

The present invention provides PV devices with a patterned glass concentrator that is easily and inexpensively produced, as well as methods of making the device, that overcomes the drawbacks associated with conventional concentrator and non-concentrator PV devices. Using the glass sheet with the convex pattern as a concentrator in the PV device of the present invention results in a substantial decrease in manufacturing and parts costs (as compared with conventional concentrator and non-concentrator PV devices), as well as a substantial increase in energy output. The patterned glass of the present invention can be manufactured on-line in a continuous process, and can function in the PV device as both concentrator and cover glass.

In an aspect of the invention, there is provided a patterned optical component that is efficient in concentrating the sun's energy.

In an aspect of the invention, there is provided a patterned glass component that is efficient in concentrating the sun's energy.

In another aspect of the invention, there is provided a method of making the patterned glass by on-line glass techniques.

In another aspect of the invention, there is provided a concentrator PV device that incorporates the patterned glass.

In yet another aspect of the invention, there is provided a method of making a concentrator PV device that incorporates the patterned glass.

In yet another aspect of the invention, there is provided a concentrator PV device in which the patterned glass functions as both the concentrator and cover glass, and thus, utilizes fewer physical components than conventional concentrator PV devices.

DETAILED DESCRIPTION OF THE INVENTION

While the present invention may be embodied in many different forms, a number of illustrative embodiments are described herein with the understanding that the present disclosure is to be considered as providing examples of the principles of the invention and such examples are not intended to limit the invention to preferred embodiments described and/or illustrated herein. The various embodiments are disclosed with sufficient detail to enable those skilled in the art to practice the invention. It is to be understood that other embodiments may be employed, and that structural and logical changes may be made without departing from the spirit or scope of the present invention.

The present invention provides a patterned glass component for a PV device that is easily and inexpensively produced by well-known patterned glass production techniques. The present invention also provides a method of making patterned glass as well as a PV device that incorporates the patterned glass in accordance with the present invention.

As referred to herein, "concentrator," or "concentrator PV device" refers to a component, or PV device incorporating a component, respectively, that is designed to concentrate, or focus, solar energy onto solar cell materials, such as, for example, silicon material.

As referred to herein, "flat plate" or "flat plate PV device" refers to a component, or PV device incorporating a component, respectively, that does not concentrate, or focus, solar energy onto solar cell materials, such as, for example, silicon material.

As referred to herein, "disposed on" means that the component, substrate or material is directly or indirectly positioned or applied above the referenced component, substrate or material. If positioned or applied indirectly, one or more components, substrates or materials may intervene.

The inventors of the subject matter herein have found that simple and well known patterned glass sheet making techniques can provide patterned glass sheets with beneficial light concentrating properties. Such light concentrating properties allow for the fabrication of concentrator PV devices that utilize significantly less PV material, thereby lowering the cost of fabrication of such PV devices.

Figure 1:
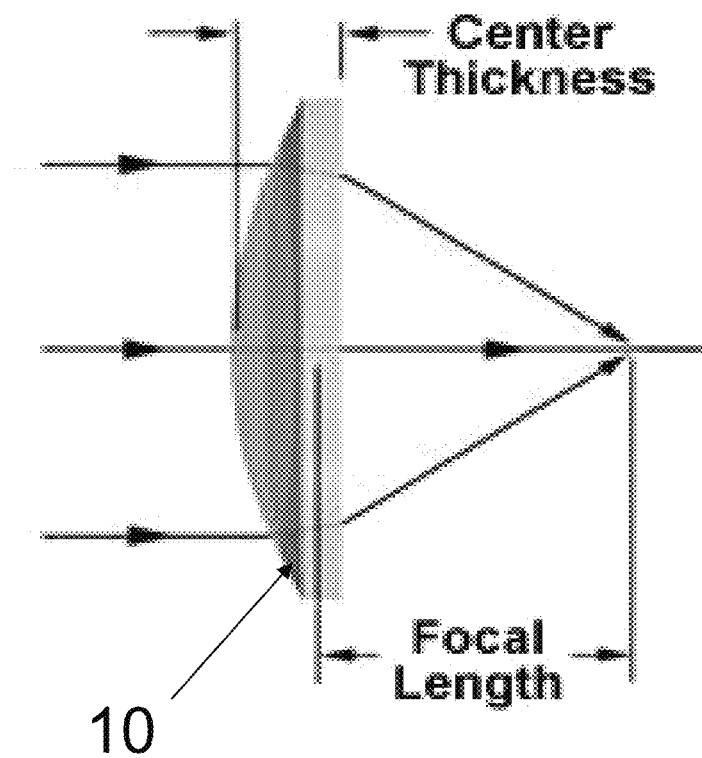
FIG. 1 shows the geometrical representation of light concentration from a convex optical component.

A non-limiting example includes patterns that have features that act as, or mimic the behavior of, an optical lens. More specifically, the features that act as, or mimic the behavior of, an optical lens, and desired for concentrator PV devices and applications described herein, are convex type features. Convex type features are known to focus light passing through the convex type feature at a certain distance beyond, or behind, the convex type feature, known as the focal length. For optical lenses, there are two major types of convex features, biconvex and piano-convex. A biconvex type lens, or feature, is one where the two major optical surfaces are convex. A piano-convex type lens, or feature, is one where one major optical surface is convex and the other major optical surface is flat, or planar. A piano-convex type lens 10 is shown in FIG. 1, along with a representation of how such a lens can concentrate light. As light passes thru the convex lens, it is focused to a point somewhere beyond, or below, the convex lens. The point where the light becomes focused is known as the focal length. Thus, incorporation of the aforementioned convex type features onto at least one optical surface of a glass sheet can provide patterned glass with light concentrating properties that are desirable for concentrator PV devices and applications.

The production of patterned glass sheets is well known to those of skill in the art. These include on-line methods and casting methods. In casting methods, glass raw materials are melted in a furnace and the glass melt is poured into a die, or mold. When the glass melt sufficiently cools, the die is removed, leaving the patterned glass. In on-line methods, glass raw materials are melted in a furnace and the glass melt is then passed through, or pulled through, rollers that possess the shapes desired to be imparted to at least one surface of the eventual patterned glass sheet. On-line methods offer the advantage of being able to produce a continuous sheet of glass, commonly referred to as ribbon. In other words, on-line methods are advantageous because patterned glass made by on-line methods is significantly cheaper than patterned glass made by casting methods.

Figure 2:
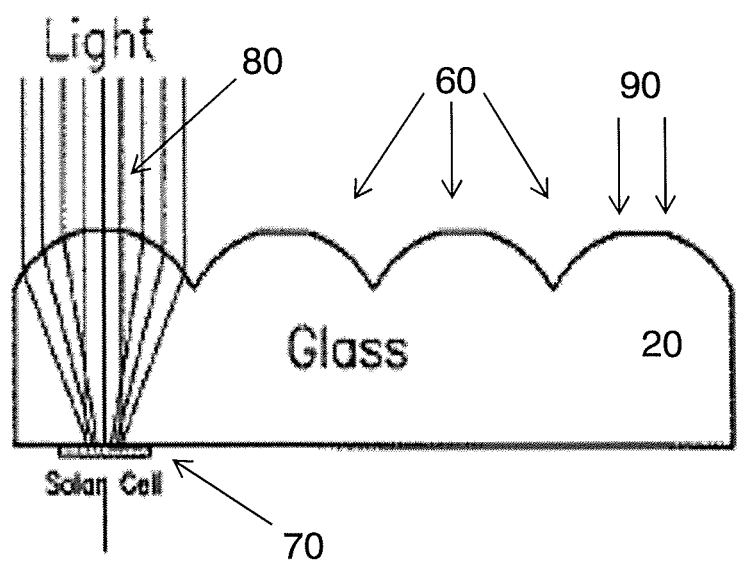
FIG. 2 shows the configuration of the patterned glass component of a concentrator PV device in accordance with the present invention, along with a representation of the way the patterned glass is designed to concentrate solar energy onto a solar cell.

An embodiment of the patterned glass sheet 20 in accordance with the present invention is shown in FIG. 2, along with a representation of how light passing through the patterned glass is concentrated onto a thin strip of a solar cell material 70 disposed below the patterned glass. The patterned glass sheet shown in FIG. 2 achieves its desired light concentrating properties by utilization of a series of convex portions 60 that act as convex optical lenses. The embodiment shown in FIG. 2 is representative. The embodiment shown has a series of four adjacently disposed convex features 60. In this embodiment, the convex features are not continuously rounded, and the upper portion 90 of the convex features is flat. Those of skill in the art will recognize and appreciate that the patterned glass sheets in accordance with the present invention may have more, or less, than four adjacently disposed convex features and can be made with as many adjacent convex features as desired.

Figure 3:
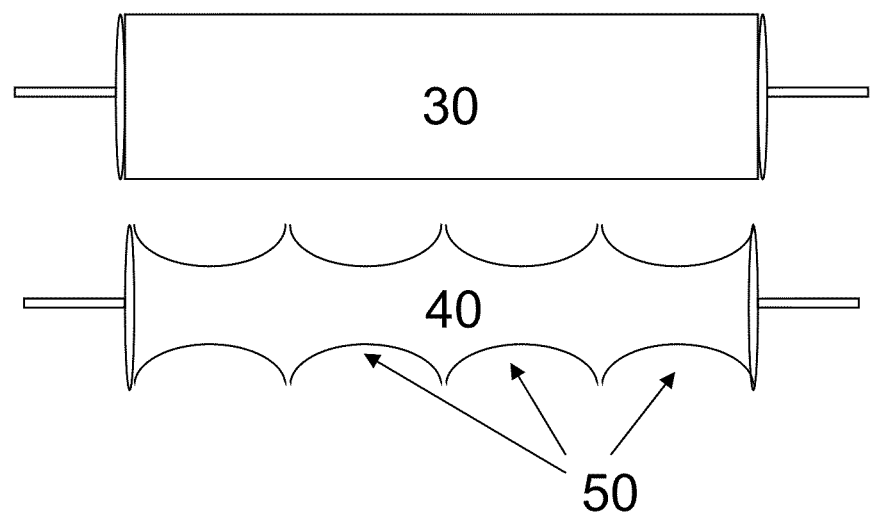
FIG. 3 shows an embodiment of the rollers used in forming patterned glass in accordance with the present invention.

Glass ribbon made by on-line methods is, typically, a long and continuous sheet of glass that needs to be cut prior to further processing and/or packaging and shipping to customers. Cutting a patterned surface of a patterned glass ribbon is problematic because the glass ribbon must be scored from one side to the other with a scoring tool that runs along a surface of, and maintains contact with, the glass ribbon. Therefore, it is preferred to use a piano-convex patterned type glass for purposes herein because the optical surface of the patterned glass that is flat, or planar, allows for efficient scoring of the glass ribbon. FIG. 3 shows an embodiment of the rollers that can be used to produce patterned glass sheets in accordance with the present invention. Glass raw materials are melted in a furnace and then passed, or pulled, through the upper roller 30 and lower roller 40 at elevated temperatures. The upper roller 30 is typically of a cylindrical shape with a flat surface so as to impress a flat optical surface upon the glass ribbon. The lower roller 40 is typically of a shape shown in FIG. 3. A series of concave portions 50 are adjacently disposed on the lower roller 40 so as to allow the lower roller 40 to impress a series of adjacent convex optical surfaces upon the glass ribbon. After forming the patterned glass ribbon, the ribbon is rolled along a conveyor line where it is annealed in an annealing furnace and then scored and broken into more manageable sizes.

The patterned glass of the present invention is to be used for light concentration onto a thin strip of solar cell material. Therefore, to optimize potential concentrator PV device efficiency with PV components of the present invention, it is typically desired to have as much light transmission as possible through the patterned glass. This can be achieved with non-colored, or clear, patterned glasses. Types of clear glasses that are suitable for purposes herein are well known to those of skill in the art. These include, without limitation, standard soda-lime type glasses and solar type glasses, such as glasses with a low total iron content. For purposes herein, it is preferred to utilize a solar type glass with a total iron content in the range of about 0.001-0.100 weight percent. It is more preferred to utilize a solar type glass with a total iron content of about 0.005-0.050 weight percent. It is most preferred to utilize a solar type glass with a total iron content of about 0.005-0.020 weight percent.

As will be recognized by those of skill in the art, functional PV devices are often subjected to harsh environmental conditions, such as high winds and precipitation. Thus, it is preferred that the patterned glass sheets in accordance with the present invention are heat strengthened, or tempered, so as to ensure an increased durability of the patterned glass. Notably, the patterned glass of the present invention, in addition to functioning as a concentrator in the PV device, also functions as the cover glass, thereby further reducing manufacturing costs.

To date, the PV, or solar cell, material used in the solar cells represents the most expensive aspect of PV device fabrication. Thus, there is a need for a PV device that can minimize the amount of solar cell material used. Patterned glass in accordance with the present is efficient at concentrating the diffuse energy from the sun. It is this concentration that allows for production of PV devices that utilize significantly less solar cell material. The solar cell material used in accordance with the present invention is not particularly limited, as long as the solar cell material is a known and accepted material used in PV devices.

Silicon is most frequently used in PV devices because of its availability and known performance characteristics. For purposes herein, it is preferable to utilize silicon as the solar cell material because of the aforementioned reasons. The silicon can be of the amorphous or crystalline type. Crystalline types of silicon that can be used in accordance with the present invention are nano-crystalline silicon, micro-crystalline silicon, poly-crystalline silicon, mono-crystalline silicon and combinations thereof. The size of the solar cell material is not particularly limited. The solar cell material may be from about 1 mm in length, width and/or height to as much as multiple meters in length, width and/or height. In a preferred embodiment, the solar cell material is less than about 1 m in length and less than 20 mm in width and height. In a more preferred embodiment, the solar cell material is less than about 500 mm in length and less than 10 mm in width and height. In a most preferred embodiment, the solar cell material is less than about 155 mm in length and less than 5 mm in width and/or height.

It is desirable to dispose the solar cells below the flat, or planar, optical surface of the patterned glass in accordance with the present invention, with the patterned optical surface having the convex portions facing away from the solar cells so as to be incident with light from the sun. It is further desirable to dispose the solar cells such that they are in contact with the flat, or planar, surface of the patterned glass. For concentrator PV devices, light that is more evenly spread across a solar cell surface area leads to a PV device that is more efficient when compared to light that is narrowly focused on the same solar cell surface area. Thus, it is beneficial to dispose solar cells at a finite distance above the focal length of the convex features of the patterned glass described herein. Accordingly, the patterned glass in accordance with the present invention allows for fabrication of concentrator PV devices that utilize significantly less PV material. For example, flat plate PV devices based on silicon typically require fairly large pieces of silicon block material. However, concentrator PV devices that incorporate patterned glass in accordance with the present invention allow for much less silicon block material to be used in the PV device. The silicon block material can be cut into thin strips and centrally disposed below the convex features of the patterned glass described herein, as shown in FIG. 2.

Moreover, conventional concentrator PV devices typically utilize at least 3 major components: 1) the PV material; 2) cover glass; and 3) a solar concentrator. The patterned glass in accordance with the present invention allows for the separate combination of the cover glass and the solar concentrator into a single component. Accordingly, the patterned glass of the present invention can serve not only as a means for concentrating solar energy, but also as a PV cover glass, thereby eliminating process steps in PV device manufacturing and minimizing the number of physical components of the PV device, thus, allowing for a concentrator PV device with only 2 major components.

Figure 4A:
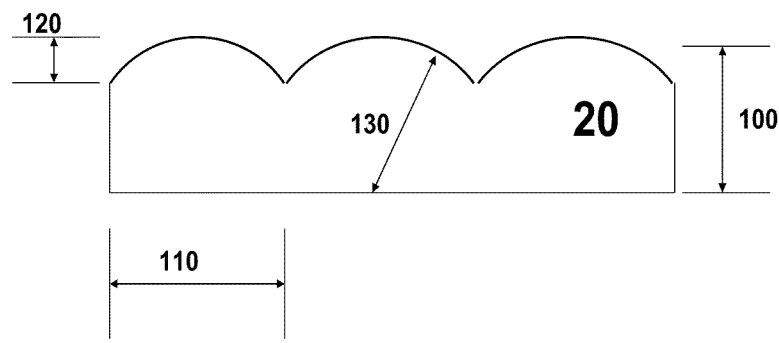
FIG. 4 defines the dimensions (FIG. 4A) and shows the specific dimensions (FIG. 4B) of an embodiment of the patterned glass in accordance with the present invention.

The size of the patterned glass of the present invention is not particularly limited and the dimensions discussed in this paragraph are shown in FIG. 4A. The thickness 100 of the patterned glass of the present invention may be from about 1 mm thick to as much as 1 m thick. In a preferred embodiment, the thickness 100 is less than about 10 mm. In a more preferred embodiment, the thickness 100 is less than about 8 mm. In a most preferred embodiment, the thickness 100 is less than about 6 mm. The width 110 of each convex feature of the patterned glass of the present invention may be from about 1 mm to as much as 1 m wide. In a preferred embodiment, the width 110 of each convex feature is less than about 10 mm. In a more preferred embodiment, the width 110 of each convex feature is less than about 8 mm. In a most preferred embodiment, the width 110 of each convex feature is less than about 6 mm. The radius 130 of the convex features of the patterned glass of the present invention may be from about 1 mm to as much as 1 m. In a preferred embodiment, the radius 130 of each convex feature is less than about 20 mm. In a more preferred embodiment, the radius 130 of each convex feature is less than about 10 mm. In a most preferred embodiment, the radius 130 of each convex feature is less than about 5 mm. The height 120 of each convex feature of the patterned glass of the present invention may be from about 0.5 mm to as much as 1 m. In a preferred embodiment, the height 120 of each convex feature is less than about 20 mm. In a more preferred embodiment, the height 120 of each convex feature is less than about 10 mm. In a most preferred embodiment, the height 120 of each convex feature is less than about 5 mm.

Example 1

Figure 4B:
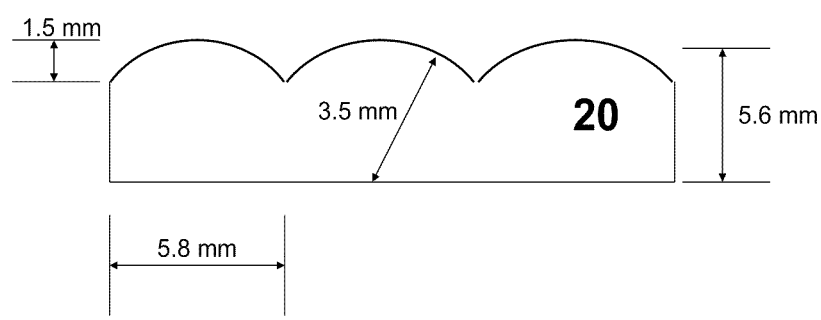

An embodiment of the patterned glass 20 in accordance with the present invention is shown in FIG. 4B. The patterned glass 20 is formed from melting glass raw materials to have a composition as described in Table 1. Glass raw materials are melted in a glass melting furnace and pulled through an upper roller 30 and lower roller 40, FIG. 3, that shapes the glass melt into the patterned glass 20 shown in FIG. 4B. The patterned glass 20 has a thickness 100, from the planar optical surface to the top of a convex feature, of about 5.6 mm and a width 110 of each convex feature of about 5.8 mm. For the convex features disposed on an optical surface of patterned glass 20 described herein, the convex feature has a height 120 of about 1.5 mm and a radius 130 of about 3.5 mm, but is not continuously rounded. The upper portion of the convex feature is flat, with a width of about 1.45 mm.

TABLE 1

Representative Glass Compositions of the Patterned Glass in Accordance with the Present Invention.

| Ingredient | Weight % Range |
| --- | --- |
| $SiO_2$ | 70.0-74.0 wt. % |
| $Al_2O_3$ | 0.60-0.10 wt. % |
| CaO | 8.0-10.0 wt. % |
| MgO | 3.5-5.0 wt. % |
| $Na_2O$ | 12.0-15.0 wt. % |
| $K_2O$ | 0.025-0.055 wt. % |
| $Fe_2O_3$ | 0.005-0.020 wt. % |
| $TiO_2$ | 0.01-0.03 wt. % |

Example 2

An embodiment of a PV device in accordance with the present invention is described herein. Silicon block film material is cut into strips about 3.50 mm wide. Using the patterned glass of Example 1 above, the 3.50 mm wide strips of silicon film material are centrally disposed below each convex feature of the patterned glass of Example 1, as is partially shown in FIG. 2 (left most convex feature).

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A photovoltaic device comprising:
    a solar cell material having a first width; and
    a patterned glass comprising at least two optical surfaces wherein at least one of the optical surfaces has formed thereon a series of adjacently disposed, convex features that are able to concentrate and/or focus light;
    wherein the convex features comprise an upper portion that is flat;
    wherein the upper portion that is flat has a second width;
    wherein the second width is less than the first width;
    wherein the convex features have a third width;
    wherein the first width is substantially 60% of the third width;
    wherein said patterned glass is disposed on and in direct contact with said solar cell material, with the convex features directed away from the solar cell material; and
    further wherein the light concentrated and/or focused onto the solar cell material is evenly spread across the solar cell surface by the convex features.

2. The photovoltaic device according to claim 1, wherein one of the optical surfaces of the patterned glass is opposite the optical surface with said adjacently disposed, convex features formed thereon and is flat.

3. The photovoltaic device according to claim 1, wherein the patterned glass has a thickness of less than 10 mm.

4. The photovoltaic device according to claim 1, wherein the patterned glass has a thickness of less than 8 mm.

5. The photovoltaic device according to claim 1, wherein the patterned glass has a thickness of less than 6 mm.

6. The photovoltaic device according to claim 1, wherein the width of the convex features of the patterned glass are less than 10 mm.

7. The photovoltaic device according to claim 1, wherein the width of the convex features of the patterned glass are less than 6 mm.

8. The photovoltaic device according to claim 1, wherein at least one solar cell is centrally disposed below at least one of the convex features of the patterned glass.

9. The photovoltaic device according to claim 1, wherein the solar cell material comprises silicon.

10. The photovoltaic device according to claim 1, wherein the glass contains less than 0.10 weight percent of total iron content.

11. The photovoltaic device according to claim 10, wherein the glass contains less than 0.02 weight percent of total iron content.

12. The photovoltaic device according to claim 1, wherein the glass is made by an on-line method.

13. The photovoltaic device according to claim 1, wherein said solar cell material is disposed at a predetermined distance from the convex features of said patterned glass;
    said predetermined distance is shorter than the focal length of said convex features.

14. The photovoltaic device according to claim 1, wherein said patterned glass is heat strengthened or tempered.

15. The photovoltaic device according to claim 1, wherein said patterned glass functions as a cover glass and a separate cover glass is not included.

16. A photovoltaic device comprising:
    a solar cell material having a first width; and
    a patterned glass, disposed on and in direct contact with said solar cell material, comprising at least two optical surfaces wherein at least one of the optical surfaces has formed thereon a series of adjacently disposed, convex features that are able to concentrate and/or focus light;
    wherein the convex features comprise an upper portion that is flat;
    wherein the upper portion that is flat has a second width;
    wherein the second width is less than the first width;
    wherein the convex features have a third width;
    wherein the first width is substantially 60% of the third width;
    wherein the patterned glass is formed by an on-line method; and
    further wherein the light concentrated and/or focused onto the solar cell material is evenly spread across the solar cell surface by the convex features.

17. The photovoltaic device according to claim 16, wherein the patterned glass has a thickness of less than 10 mm.

18. The photovoltaic device according to claim 16, wherein the patterned glass has a thickness of less than 8 mm.

19. The photovoltaic device according to claim 16, wherein the patterned glass has a thickness of less than 6 mm.

20. The photovoltaic device according to claim 16, wherein the width of the convex features of the patterned glass are less than 10 mm.

21. The photovoltaic device according to claim 20, wherein the width of the convex features of the patterned glass are less than 6 mm.

22. The photovoltaic device according to claim 16, wherein the solar cell material is centrally disposed below at least one of the convex features of the patterned glass.

23. The photovoltaic device according to claim 16, wherein the solar cell material comprises silicon.

24. The photovoltaic device according to claim 16, wherein the glass contains less than 0.10 weight percent of total iron content.

25. The photovoltaic device according to claim 24, wherein the glass contains less than 0.02 weight percent of total iron content.

26. The photovoltaic device according to claim 16, wherein said patterned glass functions as a cover glass and a separate cover glass is not included.

27. A photovoltaic device comprising:
a solar cell material having a first width; and
a patterned glass comprising at least two optical surfaces wherein at least one of the optical surfaces has formed thereon a series of adjacently disposed, convex features that are able to concentrate and/or focus light;
wherein the convex features comprise an upper portion that is flat;
wherein the upper portion that is flat has a second width;
wherein the second width is less than the first width;
wherein the convex features have a third width;
wherein the first width is substantially 60% of the third width;
wherein said patterned glass is disposed on and in direct contact with said solar cell material, with the convex features directed away from the solar cell material and wherein said patterned glass functions as a cover glass and a separate cover glass is not included; and
further wherein the light concentrated and/or focused onto the solar cell material is evenly spread across the solar cell surface by the convex features.

* * * * *